United States Patent
Lou et al.

(10) Patent No.: US 9,293,479 B2
(45) Date of Patent: Mar. 22, 2016

(54) OXIDE SEMICONDUCTOR TFT ARRAY SUBSTRATE AND OXIDE SEMICONDUCTOR TFT DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Junhui Lou, Shanghai (CN); Sitao Huo, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 93 days.

(21) Appl. No.: 14/091,054

(22) Filed: Nov. 26, 2013

(65) Prior Publication Data
US 2014/0374740 A1 Dec. 25, 2014

(30) Foreign Application Priority Data
Jun. 24, 2013 (CH) .......................... 2013 1 0254826

(51) Int. Cl.
*H01L 29/12* (2006.01)
*H01L 27/12* (2006.01)

(52) U.S. Cl.
CPC .......... *H01L 27/1225* (2013.01); *H01L 27/127* (2013.01); *H01L 27/1255* (2013.01)

(58) Field of Classification Search
CPC ................. H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742; G02F 1/133514; G02F 1/1368; G02F 2001/133567; G02F 2001/133565; G02F 2001/133357
USPC .............. 257/43, 71, 443, 40, 87, 89, 98, 100
See application file for complete search history.

(56) References Cited

U.S. PATENT DOCUMENTS

| | | | |
|---|---|---|---|
| 2005/0157226 A1* | 7/2005 | Lan | 349/106 |
| 2008/0158458 A1* | 7/2008 | Yang | 349/43 |
| 2009/0101908 A1* | 4/2009 | Kwack | 257/59 |
| 2009/0153056 A1* | 6/2009 | Chen et al. | 315/51 |
| 2010/0227442 A1 | 9/2010 | Lu et al. | |
| 2010/0244037 A1 | 9/2010 | Shiota | |
| 2013/0153904 A1 | 6/2013 | Nishimura et al. | |

FOREIGN PATENT DOCUMENTS

WO  WO2013141062 A1  9/2013

* cited by examiner

*Primary Examiner* — Dung Le
(74) *Attorney, Agent, or Firm* — Alston & Bird LLP

(57) ABSTRACT

A TFT array substrate is disclosed. The substrate includes a TFT having a gate insulation layer, and an active layer partly thereon. The TFT also has a first part of an etch barrier layer on the active layer, and a source and drain on the first part of the etch barrier layer. The substrate also includes a capacitance having a first electrode plate, a second part of the gate insulation layer on the first electrode plate, a second part of the etch barrier layer on the second part of the gate insulation layer, and a second electrode plate on the second part of the etch barrier layer. The second part of the etch barrier layer has a thickness less than the first part of the etch barrier layer, and/or there is no etch barrier layer between the second part of the gate insulation layer and the second electrode plate.

8 Claims, 4 Drawing Sheets

OXIDE SEMICONDUCTOR TFT ARRAY SUBSTRATE AND OXIDE SEMICONDUCTOR TFT DISPLAY DEVICE

CROSS-REFERENCES TO RELATED APPLICATIONS

The present application claims the benefit of priority to Chinese Patent Application No. 201310254826.6, entitled "OXIDE SEMICONDUCTOR TFT ARRAY SUBSTRATE AND METHOD FOR FORMING THE SAME", filed with the Chinese Patent Office on Jun. 24, 2013, the content of which is incorporated herein by reference in its entirety.

FIELD OF THE DISCLOSURE

The present disclosure generally relates to semiconductor technology, and more particularly, to an oxide semiconductor TFT array substrate and a method for forming the same.

BACKGROUND OF THE INVENTION

Currently, thin-film-transistor (TFT) technology is widely used in the technical field of panel displays including liquid crystal displays, organic emitting displays, and the like. Conventionally, active layers used in TFT technology may normally include a semiconductor material such as amorphous silicon (a-Si), polycrystalline silicon (p-Si), or the like. Among the conventional TFTs, a-Si TFTs are more widely used because they can fit panel display products with almost all sizes. However, current p-Si TFTs may only be used in products with medium or small sizes due to the limitation of film uniformity thereof. Specifically, a-Si TFTs have advantages like simple structure and high uniformity for mass production, and drawbacks like low migration rate (about 0.5 cm$^2$/V·s) and poor light stability. Although p-Si TFTs have a migration rate (normally larger than 10 cm$^2$/V·s) much larger than that of a-Si TFTs, they have disadvantages such as complex structure, large leakage current and poor uniformity for mass production. Along with the fast development of panel display technology, TFTs are required to have better performance. However, conventional a-Si TFTs and p-Si TFTs may not be capable of meeting the requirements. Therefore, there is a need to improve the TFT technology. Currently, metal-oxide TFT technology seems to be a promising substitute.

Active layers of metal-oxide TFTs are made of a metal oxide, which may bring a relatively wide forbidden band (normally larger than 3.0 eV) and a relatively high migration rate (about 10 cm$^2$/V·s). Wider forbidden bands may bring good light stability. Therefore, compared with a-Si TFTs, metal-oxide TFTs may be manufactured as complete transparent devices, thereby tremendously increasing the aperture opening rate and thus reducing the display power consumption. In conclusion, metal-oxide TFTs may have the advantages of a-Si TFTs and p-Si TFTs. Besides, metal-oxide TFTs are suitable for mass production. Therefore, in the coming future, metal-oxide TFTs are very likely to become a mainstream in active electronic driving components used in panel displays.

FIG. 1 schematically illustrates a cross-sectional view of a conventional metal-oxide TFT array substrate. The metal-oxide TFT array substrate includes a substrate 1, a TFT and a storage capacitance 101 formed on the substrate 1. Specifically, the metal-oxide TFT array substrate includes a gate 2 and a lower electrode plate 3 of the storage capacitance 101 on the substrate 1, an gate insulation layer 4 on the gate 2 and the lower electrode plate 3, an active layer 5 on the gate insulation layer 4, an etch barrier layer 6 on the active layer 5, and a source 7, a drain 8 and a upper electrode plate 9 of the storage capacitance 101 on the etch barrier layer 6. The gate 2, the gate insulation layer 4, the active layer 5, the source 7 and the drain 8 constitute the TFT. The lower electrode plate 3, the gate insulation layer 4, the etch barrier layer 6 and the upper electrode plate 9 constitute the storage capacitance 101. The gate 2, the gate insulation layer 4, the active layer 5, the etch barrier layer 6 and the source 7 form a parasitic capacitance 103, and the gate 2, the gate insulation layer 4, the active layer 5, the etch barrier layer 6 and the drain 8 form a parasitic capacitance 102. To improve the device performance of the metal-oxide TFT array substrate, the storage capacitance 101 may have a higher capacitance value, while the source and drain parasitic capacitances 103 and 102 may have lower capacitance values.

The capacitance value of the storage capacitance 101 may be increased by enlarging the upper electrode plate 9 and the lower electrode plate 3, or reducing the thickness of insulation materials between the electrode plates, i.e., the thickness of the gate insulation layer 4 and the etch barrier layer 6. However, in the above described metal-oxide TFT array substrate, the gate insulation layer 4 and the etch barrier layer 6 also function as insulation materials between electrode plates of the source parasitic capacitance 103 and the drain parasitic capacitance 102. Further, the thickness of the gate insulation layer 4 and the etch barrier layer 6 in the source and drain parasitic capacitances 103 and 102 is the same as the thickness of the gate insulation layer 4 and the etch barrier layer 6 in the storage capacitance 101. Therefore, if the thickness of the gate insulation layer 4 and the etch barrier layer 6 is reduced to increase the capacitance value of the storage capacitance 101, the capacitance values of the source and drain parasitic capacitances 103 and 102 will also be increased.

Normally, electrode plates of a capacitance are made of metal. The upper electrode plate 9 and the lower electrode plate 3 of the storage capacitance 101 as shown in FIG. 1 are made of metal which is opaque. As a result, if the capacitance value of the storage capacitance is increased by enlarging the electrode plates thereof, the aperture opening rate of a pixel unit may decrease.

In conclusion, currently, increasing the capacitance value of the storage capacitance in the TFT array substrate may result in reducing the aperture opening rate or deteriorate the device performance.

BRIEF SUMMARY OF THE INVENTION

One inventive aspect is an oxide semiconductor TFT array substrate. The substrate includes a thin film transistor having a gate, a first part of a gate insulation layer on the gate, and an active layer on the first part of the gate insulation layer, where the active layer includes an oxide semiconductor layer. The thin film transistor also has a first part of an etch barrier layer on the active layer, and a source and a drain on the first part of the etch barrier layer. The substrate also includes a storage capacitance having a first electrode plate, a second part of the gate insulation layer on the first electrode plate, a second part of the etch barrier layer on the second part of the gate insulation layer, and a second electrode plate on the second part of the etch barrier layer. In addition, at least one of: the second part of the etch barrier layer above the first electrode plate has a thickness less than a thickness of the first part of the etch barrier layer above the gate, and there is no etch barrier layer disposed between the second part of the gate insulation layer and the second electrode plate.

Another inventive aspect is an oxide semiconductor TFT display device, including an oxide semiconductor TFT array substrate. The substrate includes a thin film transistor having a gate, a first part of a gate insulation layer on the gate, and an active layer on the first part of the gate insulation layer, where the active layer includes an oxide semiconductor layer. The thin film transistor also has a first part of an etch barrier layer on the active layer, and a source and a drain on the first part of the etch barrier layer. The substrate also includes a storage capacitance having a first electrode plate, a second part of the gate insulation layer on the first electrode plate, a second part of the etch barrier layer on the second part of the gate insulation layer, and a second electrode plate on the second part of the etch barrier layer. In addition, at least one of: the second part of the etch barrier layer above the first electrode plate has a thickness less than a thickness of the first part of the etch barrier layer above the gate, and there is no etch barrier layer disposed between the second part of the gate insulation layer and the second electrode plate.

Another inventive aspect is a method for forming an oxide semiconductor TFT array substrate. The method includes forming a first conducting layer on a substrate, etching the first conducting layer to form a gate of a thin film transistor and a first electrode plate of a storage capacitance, and forming a gate insulation layer on the first conducting layer. The method also includes forming an oxide semiconductor layer on the gate insulation layer, etching the oxide semiconductor layer to form an active layer, and forming an etch barrier layer on the oxide semiconductor layer. The method also includes etching the etch barrier layer to form through holes on top of the active layer and partially removing the etch barrier layer above the first electrode plate, forming a second conducting layer on the etch barrier layer, and etching the second conducting layer to form a source and a drain of the thin film transistor and a second electrode plate of the storage capacitance.

Another inventive aspect is a method for forming an oxide semiconductor TFT array substrate. The method includes forming a first conducting layer on a substrate, etching the first conducting layer to form a gate of a thin film transistor and a first electrode plate of a storage capacitance, and forming a gate insulation layer on the first conducting layer. The method also includes forming an oxide semiconductor layer on the gate insulation layer, etching the oxide semiconductor layer to form an active layer, and forming an etch barrier layer on the oxide semiconductor layer. The method also includes etching the etch barrier layer to form through holes on top of the active layer and completely removing the etch barrier layer above the first electrode plate, forming a second conducting layer on the etch barrier layer, and etching the second conducting layer to form a source and a drain of the thin film transistor and a second electrode plate of the storage capacitance.

DETAILED DESCRIPTION OF THE INVENTION

In order to clarify the technical contents of the present disclosure, embodiments of the disclosure will be described in combination with accompanied drawings. However, the accompanying drawings and detail embodiments are not intended to limit the present disclosure. Those skilled in the art can make any variation and modification without departing from the scope of the invention.

First Embodiment

Figure 1:
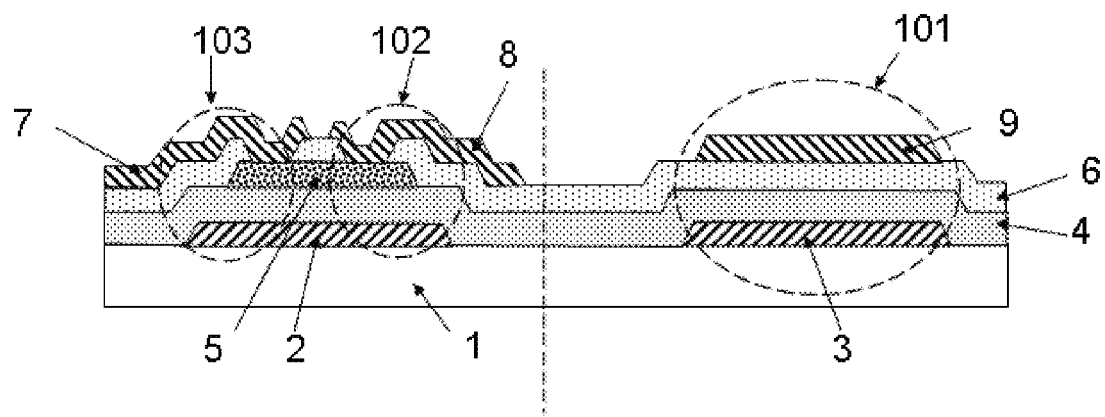
FIG. 1 schematically illustrates a cross-sectional view of a conventional metal-oxide TFT array substrate.
Figure 2:
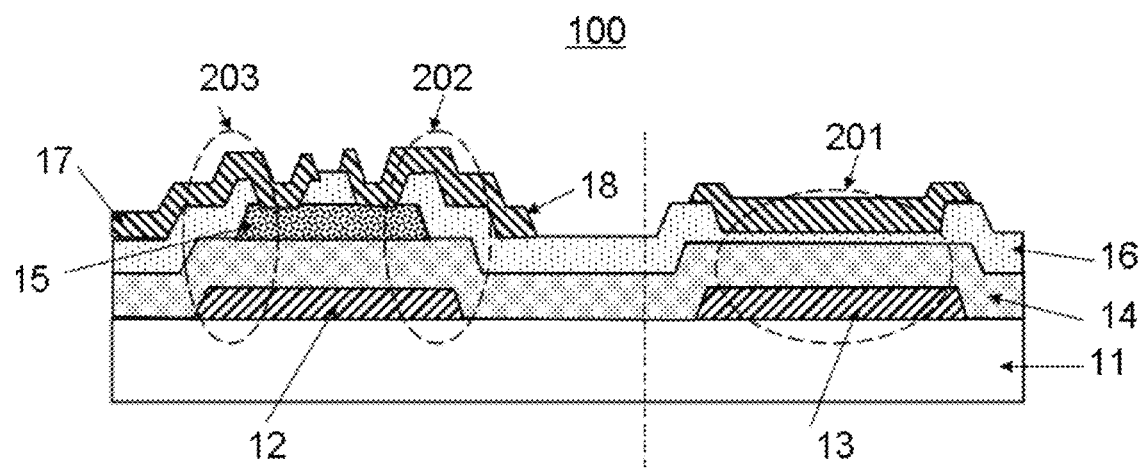
FIG. 2 schematically illustrates a cross-sectional view of an oxide semiconductor TFT array substrate according to a first example of a first embodiment of the present disclosure.

An oxide semiconductor TFT array substrate is provided according to a first embodiment of the present disclosure. FIG. 2 schematically illustrates a cross-sectional view of an oxide semiconductor TFT array substrate 100 according to a first example of the first embodiment of the present disclosure. Referring to FIG. 2, the oxide semiconductor TFT array substrate 100 includes a substrate 11, and a thin film transistor and a storage capacitance 201 on the substrate 11.

The thin film transistor includes a gate 12, a first part of a gate insulation layer 14 on the gate 12, an active layer 15 on the first part of the gate insulation layer 14, a first part of an etch barrier layer 16 on the active layer 15, and a source 17 and a drain 18 on the first part of the etch barrier layer 16. The active layer 15 is an oxide semiconductor layer. Specifically, the active layer 15 may include indium-gallium-zinc-oxide (IGZO). The source 17 and the drain 18 are respectively coupled to the active layer 15 via through holes in the first part of the etch barrier layer 16. The source 17, the first part of the etch barrier layer 16, the active layer 15, the first part of the gate insulation layer 14 and the gate 12 constitute a source parasitic capacitance 203. The drain 18, the first part of the etch barrier layer 16, the active layer 15, the first part of the gate insulation layer 14 and the gate 12 constitute a drain parasitic capacitance 202.

The storage capacitance 201 includes a first electrode plate 13, a second part of the gate insulation layer 14 on the first electrode plate 13, a second part of the etch barrier layer 16 on the second part of the gate insulation layer 14, and a second electrode plate 19 on the second part of the etch barrier layer 16.

The second part of the etch barrier layer 16 above the first electrode plate 13 has a thickness less than that of the first part of the etch barrier layer 16 above the gate 12. Specifically, a difference between the thickness of the second part of the etch barrier layer 16 above the first electrode plate 13 and the thickness of the first part of the etch barrier layer 16 above the gate 12 may range from about 10 nm to about 50 nm.

In the oxide semiconductor TFT array substrate 100 provided according to the first example of the first embodiment, both the source parasitic capacitance 203 and the drain parasitic capacitance 202 have the first part of the etch barrier layer 16, the active layer 15 and the first part of the gate insulation layer 14 as insulation materials between electrode plates thereof. The storage capacitance 201 has the second part of the gate insulation layer 14 and the second part of the etch barrier layer 16 as insulation materials between its two electrode plates. Since the second part of the etch barrier layer 16 is thinner than the first part of the etch barrier layer 16, the capacitance value of the storage capacitance 201 can be enlarged while the capacitance values of the source and drain parasitic capacitances 203 and 202 remain unchanged. Therefore, performance advantages related the storage capacitance 201, and the source and drain parasitic capacitances 203 and 202 may be achieved.

The oxide semiconductor TFT array substrate 100 provided according to the first embodiment may be used in a liquid crystal display device or an organic emitting display device for controlling the display effect of the device(s).

In the oxide semiconductor TFT array substrate 100 provided according to the first embodiment, the storage capacitance 201 may be disposed within a pixel region. Such that the storage capacitance 201 may use the electric field energy stored therein to maintain a predetermined display brightness for a corresponding pixel unit when the gate 12 controls to turn off the thin film transistor until the gate controls to turn on the thin film transistor. In some other embodiments, the storage capacitance 201 may be integrated in a peripheral circuit outside the pixel region to form some simple drive circuits in the peripheral regions, such as a gate drive circuit. Compared with conventional techniques, the storage capacitance 201 in the first embodiment of the present disclosure can provide the same capacitance value with a reduced metal area, which may reduce border size of the display device, increase integration level and reduce the manufacturing costs.

In the oxide semiconductor TFT array substrate 100 provided according to the first example of the first embodiment, the etch barrier layer 16 may include silicon oxide or aluminum oxide. The etch barrier layer 16 is mainly used to protect the oxide semiconductor layer, i.e., the active layer 15, against adverse effects from an etching process for forming the source 17 and the drain 18. The gate insulation layer 14 may include silicon oxide, silicon nitride or a dual-layer structure including silicon oxide and silicon nitride.

The oxide semiconductor TFT array substrate 100 provided according to the first example of the first embodiment may have desired thin film transistor performance together with a relatively high storage capacitance value, thus can ideally sustain displaying a frame. Further, a display device using the oxide semiconductor TFT array substrate 100 may have improved display performance and a peripheral circuit with a reduced size. Limitations to the design of thin film transistor pixel units may be reduced.

Figure 3:
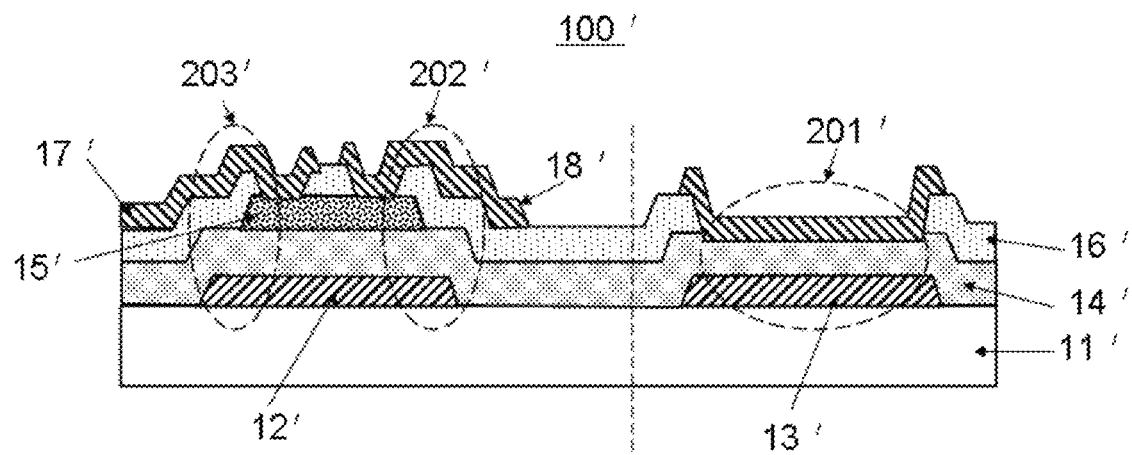
FIG. 3 schematically illustrates a cross-sectional view of an oxide semiconductor TFT array substrate according to a second example of the first embodiment of the present disclosure.

FIG. 3 schematically illustrates a cross-sectional view of an oxide semiconductor TFT array substrate according to a second example of the first embodiment. Referring to FIG. 3, in the oxide semiconductor TFT array substrate 100' provided in the second example of the first embodiment, a difference exists compared with the oxide semiconductor TFT array substrate 100. A storage capacitance 201' herein only has a gate insulation layer 14' as its insulation material. Specifically, the storage capacitance 201' includes a first electrode plate 13', a first part of the gate insulation layer 14' on the first electrode plate 13', a second electrode plate 19' on the first part of the gate insulation layer 14'. Further, the first part of the gate insulation layer 14' on the first electrode plate 13' has a thickness less than that of a second part of the gate insulation layer 14' on a gate 12'. A difference between the thicknesses of the first part and the second part may range from about 10 nm to about 50 nm.

In the oxide semiconductor TFT array substrate 100' provided in the second example of the first embodiment, the thickness of the insulation material between two electrode plates of the storage capacitance 201' may be further reduced. With the areas of the electrode plates keeping unchanged, capacitance values of a source parasitic capacitance 203' and a drain parasitic capacitance 202' may be sustained, while the capacitance value of the storage capacitance 201' may be further increased. Device performance may be improved.

Second Embodiment

Figure 4:
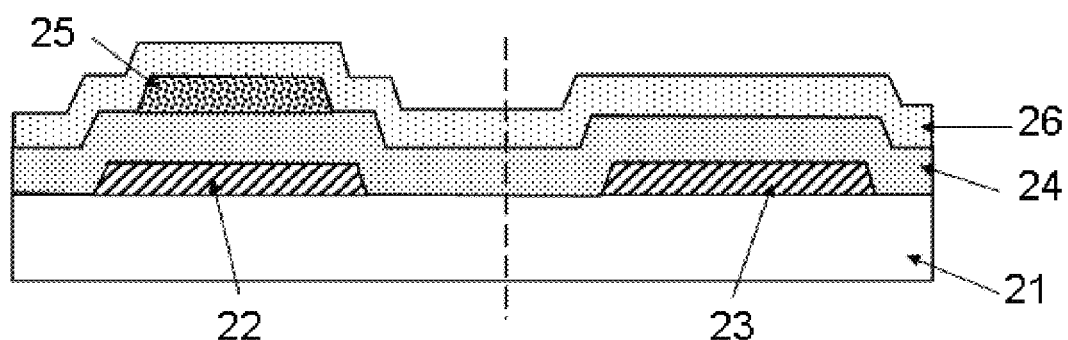
FIGS. 4 to 6 schematically illustrate cross-sectional views of intermediate structures formed in a process for forming an oxide semiconductor TFT array substrate according to a first example of a second embodiment of the present disclosure.
Figure 5:
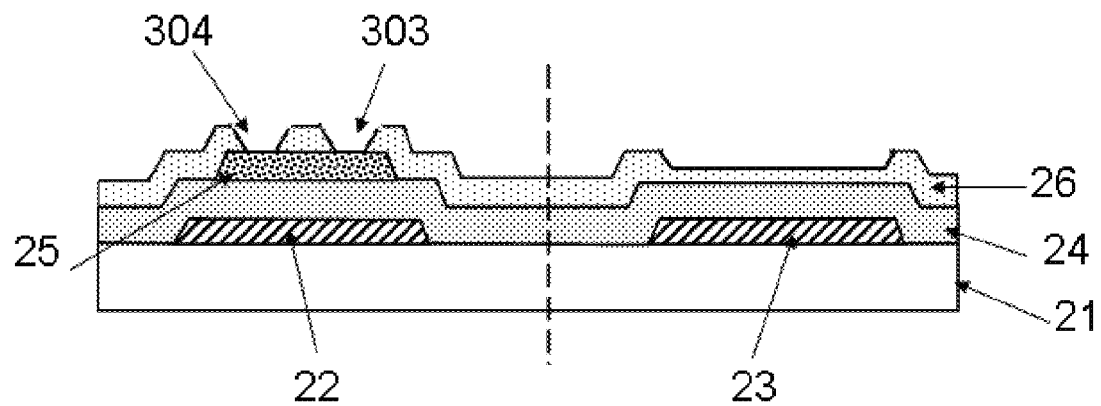
Figure 6:
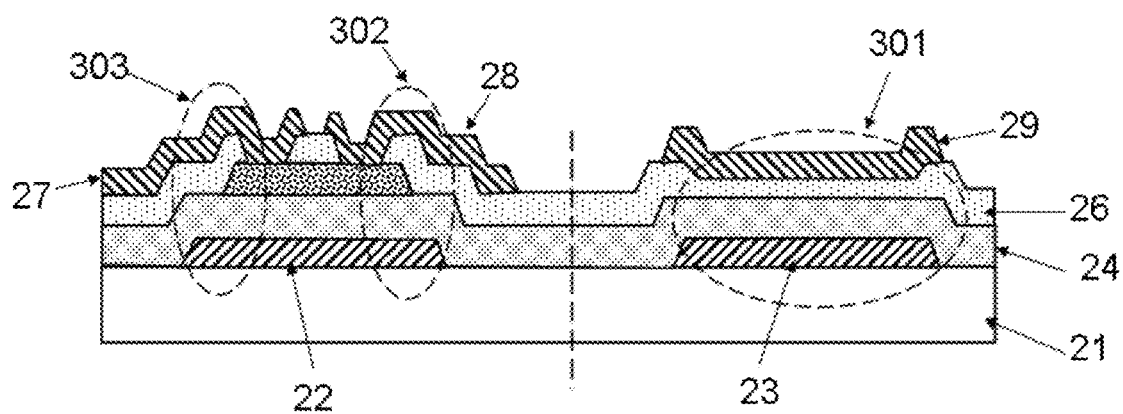

According to a second embodiment of the present disclosure, a method for forming an oxide semiconductor TFT array substrate is provided. FIGS. 4 to 6 schematically illustrate cross-sectional views of intermediate structures formed in a process forming an oxide semiconductor TFT array substrate according to a first example of the second embodiment.

Referring to FIG. 4, in step 1, a substrate 21 is provided. The substrate 21 may be a glass substrate or a flexible substrate.

Thereafter, in step 2, a first conducting layer is formed on the substrate 21. The first conducting layer may be a metal layer.

Thereafter, in step 3, the first conducting layer is etched with a first mask to form a gate 22 of a thin film transistor and a first electrode plate 23 of a storage capacitance. The first electrode plate 23 of the storage capacitance may be disposed inside a pixel region or in a circuit in peripheral areas of the pixel region.

In step 4, a gate insulation layer 24 is formed on the first conducting layer. The gate insulation layer 24 may include silicon oxide, silicon nitride or a dual-layer structure including silicon oxide and silicon nitride.

In step 5, an oxide semiconductor layer is formed on the gate insulation layer 24. The oxide semiconductor layer may include indium-gallium-zinc-oxide (IGZO).

In step 6, the oxide semiconductor layer is etched with a second mask to form an active layer 25.

In step 7, an etch barrier layer 26 is formed on the oxide semiconductor layer. The etch barrier layer may include silicon oxide or aluminum oxide. The etch barrier layer 26 is mainly used to protect the active layer 25 under the etch barrier layer 26 against adverse effects from a subsequent etching process.

Thereafter, referring to FIG. 5, in step 8, the etch barrier layer 26 is etched with a third mask to form through holes 304 and 305 on top of the active layer 25, and to reduce the thickness of a first part of the etch barrier layer 26 above the first electrode plate 23. Specifically, the third mask corresponding to the position of the first part of the etch barrier layer 26 may be a half gray tone mask, so that the first part of the etch barrier layer 26 may be partially removed to reduce the thickness thereof. A dry etch process may be performed. The dry etch process has desired anisotropy. Etch rate and selectivity of the dry etch process are controllable by adjusting concentration and speed of an etch gas used therein. Besides, slops of sidewalls of the through holes 304 and 305 result from the dry etch process are also controllable. Etch the sidewalls of the through holes 304 and 305 to have larger slops may facilitate forming films therein.

Thereafter, referring to FIG. 6, in step 9, a second conducting layer is formed on the remained etch barrier layer 26. Portions of the second conducting layer are deposited into the through holes 304 and 305.

In step 10, the second conducting layer is etched with a fourth mask to form a second electrode plate 29 of the storage capacitance, a source 27 and a drain 28. The second electrode plate 29 of the storage capacitance may be disposed inside the pixel region or in the circuit in peripheral areas of the pixel region.

Based on the method provided according to the first example of the second embodiment, both the source parasitic capacitance 303 and the drain parasitic capacitance 302 have the etch barrier layer 26, the active layer 25 and the gate insulation layer 24 as insulation materials between electrode plates thereof. The storage capacitance 301 has the gate insulation layer 24 and the first part of the etch barrier layer 26 with reduced thickness as insulation materials between its two electrode plates. Therefore, the capacitance value of the storage capacitance 301 can be enlarged while the capacitance values of the source and drain parasitic capacitances 303 and 302 are sustained. Besides, compared with conventional formation processes, no extra processing steps are added in the method provided by the first example of the second embodiment.

Figure 7:
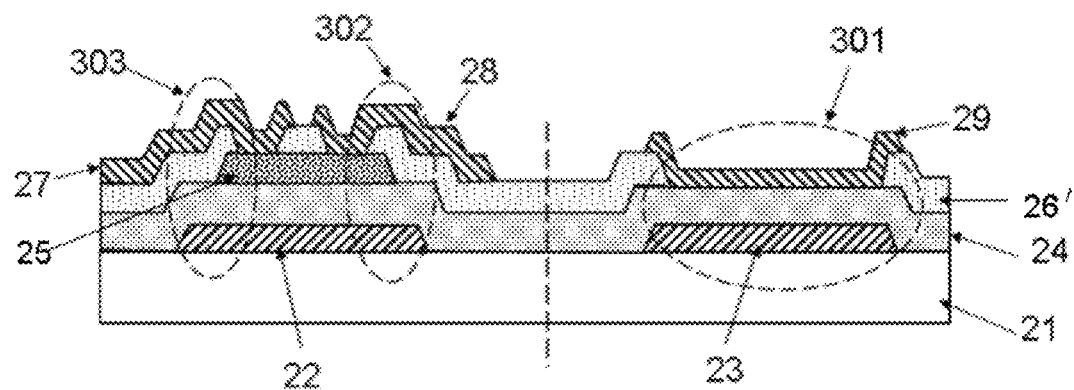
FIG. 7 schematically illustrates a cross-sectional view of an intermediate structure formed in a process for forming an oxide semiconductor TFT array substrate according to a second example of the second embodiment of the present disclosure.

FIG. 7 schematically illustrates a cross-sectional view of an intermediate structure formed in a process for forming an oxide semiconductor TFT array substrate according to a second example of the second embodiment. Processing steps in this example which are the same as the formation process in the first example of the second embodiment described above may not be illustrated again. A difference lies in step 8. Specifically, in the formation process in the second example of the second embodiment, when the etch barrier layer 26 is etched with the third mask, not only the through holes 304 and 305 are formed, but also the first part of the etch barrier layer 26 above the first electrode plate 23 is completely removed, forming an reminded etch barrier layer 26' as shown in FIG. 7. Following steps such as forming the source 27, the drain 28 and the second electrode plate 29 on the remained etch barrier layer 26' are the same as the formation process in the first example of the second embodiment described above.

In the method provided according to the second example of the second embodiment, the first part of the etch barrier layer above the first electrode plate 23 may be completely removed to further reduce the thickness of insulation material of the storage capacitance. Compared with conventional formation processes, no extra processing steps are added. The method can be simply implemented to obtain a better device performance.

Third Embodiment

According to a third embodiment of the present disclosure, a method for forming an oxide semiconductor TFT array substrate is provided. Processing steps 1 to 7 of the method provided by the third embodiment are the same as those in the second embodiment, which may not be illustrated in detail here.

Figure 8:
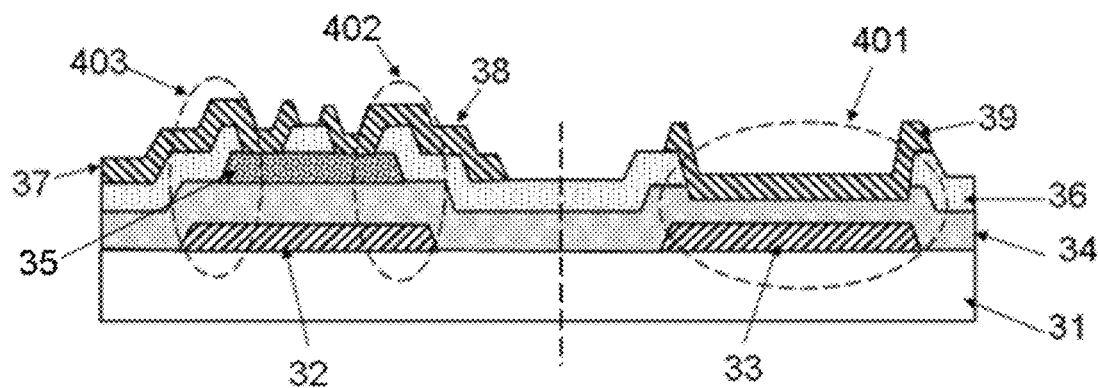
FIG. 8 schematically illustrates a cross-sectional view of an intermediate structure formed in a process for forming an oxide semiconductor TFT array substrate according to a third embodiment of the present disclosure.

A difference lies in step 8, compared with the second embodiment. Specifically, referring to FIG. 8, after a first part of an etch barrier layer 36 above a first electrode plate 33 is etched out, the etch process continues to etch a corresponding part of a gate insulation layer 34 under the first part of the etch barrier layer until the corresponding part of the gate insulation layer 34 is partially removed to obtain a desired thickness.

Thereafter, in step 9, a second conducting layer is formed on the reminded etch barrier layer 36. Portions of the second conducting layer are deposited into through holes of the reminded etch barrier layer 36. In step 10, the second conducting layer is etched to form a second electrode plate 39 of a storage capacitance, a source 37 and a drain 38. The second electrode plate 39 of the storage capacitance may be disposed inside a pixel region or in a circuit in peripheral areas of the pixel region.

In the method provided by the third embodiment, the capacitance value of the storage capacitance 401 may be larger than that of the storage capacitance 301 in the second embodiment, under condition that their electrode plate areas are the same. After the through holes are formed in the etch barrier layer 36 and the first part of the etch barrier layer 36 is removed, the etching process continues to etch the gate insulation layer 34 above the first electrode plate 31, during which an active layer 35 in an oxide semiconductor layer may also be etched via the through holes. However, as long as an etch gas selected in the etching process has a relatively high etch selectivity of an oxide semiconductor layer to the gate insulation layer 34, the etch gas may hardly affect the active layer 35. That is to say, the gate insulation layer 34 above the first electrode plate 31 may be easily removed by the etch gas while the active layer 35 is almost not consumed.

Compared with conventional formation processes, no extra processing steps are added in the method provided by the third embodiment. The method can be simply implemented to obtain a better device performance.

The invention is implemented in, but is not limited, by the embodiments discussed above. Based on the disclosure, those skilled in the art can make certain variations and modifications without departing from the scope of the invention.

What is claimed is:

1. An oxide semiconductor TFT array substrate, comprising:
   a thin film transistor, comprising:
      a gate,
      a first part of a gate insulation layer on the gate,
      an active layer on the first part of the gate insulation layer, wherein the active layer comprises an oxide semiconductor layer,
      a first part of an etch barrier layer on the active layer, and
      a source and a drain on the first part of the etch barrier layer; and
   a storage capacitor, comprising:
      a first electrode plate,
      a second part of the gate insulation layer on the first electrode plate, and
      a second electrode plate on the second part of the gate insulation layer,
   wherein the second part of the gate insulation layer on the first electrode plate has a thickness less than that of the first part of the gate insulation layer on the gate.

2. The oxide semiconductor TFT array substrate according to claim 1, wherein a difference between the thicknesses of the first part of the gate insulation layer on the gate and the second part of the gate insulation layer on the first electrode plate ranges from about 10 nm to about 50 nm.

3. The oxide semiconductor TFT array substrate according to claim 1, wherein the storage capacitor is disposed in a pixel region or a circuit in peripheral areas of the pixel region.

4. The oxide semiconductor TFT array substrate according to claim 1, wherein the active layer comprises indium-gallium-zinc-oxide.

5. An oxide semiconductor TFT display device, comprising:
   an oxide semiconductor TFT array substrate comprising:
      a thin film transistor, comprising:
         a gate,
         a first part of a gate insulation layer on the gate, an active layer on the first part of the gate insulation layer, wherein the active layer comprises an oxide semiconductor layer, a first part of an etch barrier layer on the active layer, and a source and a drain on the first part of the etch barrier layer; and a storage capacitor capacitance, comprising:

a first electrode plate, a second part of the gate insulation layer on the first electrode plate, and a second electrode plate on the second part of the gate insulation layer, wherein the second s art of the gate insulation layer on the first electrode plate has a thickness less than that of the first part of the gate insulation layer on the gate.

6. The oxide semiconductor TFT display device according to claim 5, wherein a difference between the thicknesses of the first part of the gate insulation layer on the gate and the second part of the gate insulation layer on the first electrode plate ranges from about 10 nm to about 50 nm.

7. The oxide semiconductor TFT display device according to claim 5, wherein the storage capacitor is disposed in a pixel region or a circuit in peripheral areas of the pixel region.

8. The oxide semiconductor TFT display device according to claim 5, wherein the active layer comprises indium-gallium-zinc-oxide.

\* \* \* \* \*